United States Patent
Fink et al.

(10) Patent No.: US 9,554,483 B2
(45) Date of Patent: Jan. 24, 2017

(54) ELECTRONIC DEVICE HAVING A HOUSING FOR ACCOMMODATING ELECTRONIC COMPONENTS, PREFERABLY OF A PROCESS TRANSMITTER

(71) Applicant: Endress + Hauser Flowtec AG, Reinach (CH)

(72) Inventors: Nikolai Fink, Aesch (CH); Thierry Moser, Sierentz (FR); Gernot Engstler, Riehen (CH); Ole Koudal, Oberrohrdorf (CH)

(73) Assignee: Endress + Hauser Flowtec AG, Reinach (CH)

( * ) Notice: Subject to any disclaimer, the term of this patent is extended or adjusted under 35 U.S.C. 154(b) by 15 days.

(21) Appl. No.: 14/426,782

(22) PCT Filed: Aug. 28, 2013

(86) PCT No.: PCT/EP2013/067778
§ 371 (c)(1),
(2) Date: Mar. 9, 2015

(87) PCT Pub. No.: WO2014/037256
PCT Pub. Date: Mar. 13, 2014

(65) Prior Publication Data
US 2015/0230357 A1    Aug. 13, 2015

(30) Foreign Application Priority Data
Sep. 10, 2012   (DE) .................. 10 2012 108 414

(51) Int. Cl.
*H05K 5/00* (2006.01)
*H05K 5/06* (2006.01)
(Continued)

(52) U.S. Cl.
CPC ............ *H05K 5/069* (2013.01); *H05K 5/0247* (2013.01); *H05K 7/1462* (2013.01); *H05K 7/1465* (2013.01)

(58) Field of Classification Search
USPC ............... 361/728–732, 752–753, 796, 800; 312/223.1–223.2
See application file for complete search history.

(56) References Cited

U.S. PATENT DOCUMENTS 5,793,616 A * 8/1998 Aubuchon ............ G06F 1/184
361/679.32
5,880,592 A * 3/1999 Sharpes ............ G01R 31/2879
324/750.05
(Continued)

FOREIGN PATENT DOCUMENTS

DE    19822564 A1   12/1999
DE    20219684 U1   6/2004

OTHER PUBLICATIONS

International Search Report, EPO, The Netherlands, Dec. 16, 2013.
(Continued)

*Primary Examiner* — Hung S Bui
(74) *Attorney, Agent, or Firm* — Bacon & Thomas, PLLC

(57) ABSTRACT

An electronic device having a housing for accommodating electronic components, preferably electronic components forming a process transmitter. The housing has two chambers, in which electronic components and user interfaces and/or connection elements for cable are arranged. The electronic components are arranged in a first chamber. In the case of a process transmitter, which is simple to maintain, electronic components are arranged exclusively in the first chamber, while user interfaces of the electronic components and/or connection elements for cable are positioned exclusively in the second chamber.

13 Claims, 1 Drawing Sheet

(51) Int. Cl.
H05K 7/14 (2006.01)
H05K 5/02 (2006.01)

(56) References Cited

U.S. PATENT DOCUMENTS

| | | | | |
|---|---|---|---|---|
| 5,898,387 A | * | 4/1999 | Davis | G01R 11/04 340/637 |
| 5,941,282 A | | 8/1999 | Suzuki | |
| 6,885,185 B1 | * | 4/2005 | Makinson | G01R 22/066 324/142 |
| 7,475,494 B1 | * | 1/2009 | Knight | H05K 7/1425 34/209 |
| 2008/0123259 A1 | | 5/2008 | Moser | |

OTHER PUBLICATIONS

English Translation of the International Preliminary Report on Patentability, WIPO, Geneva, CH, Mar. 19, 2015.

* cited by examiner

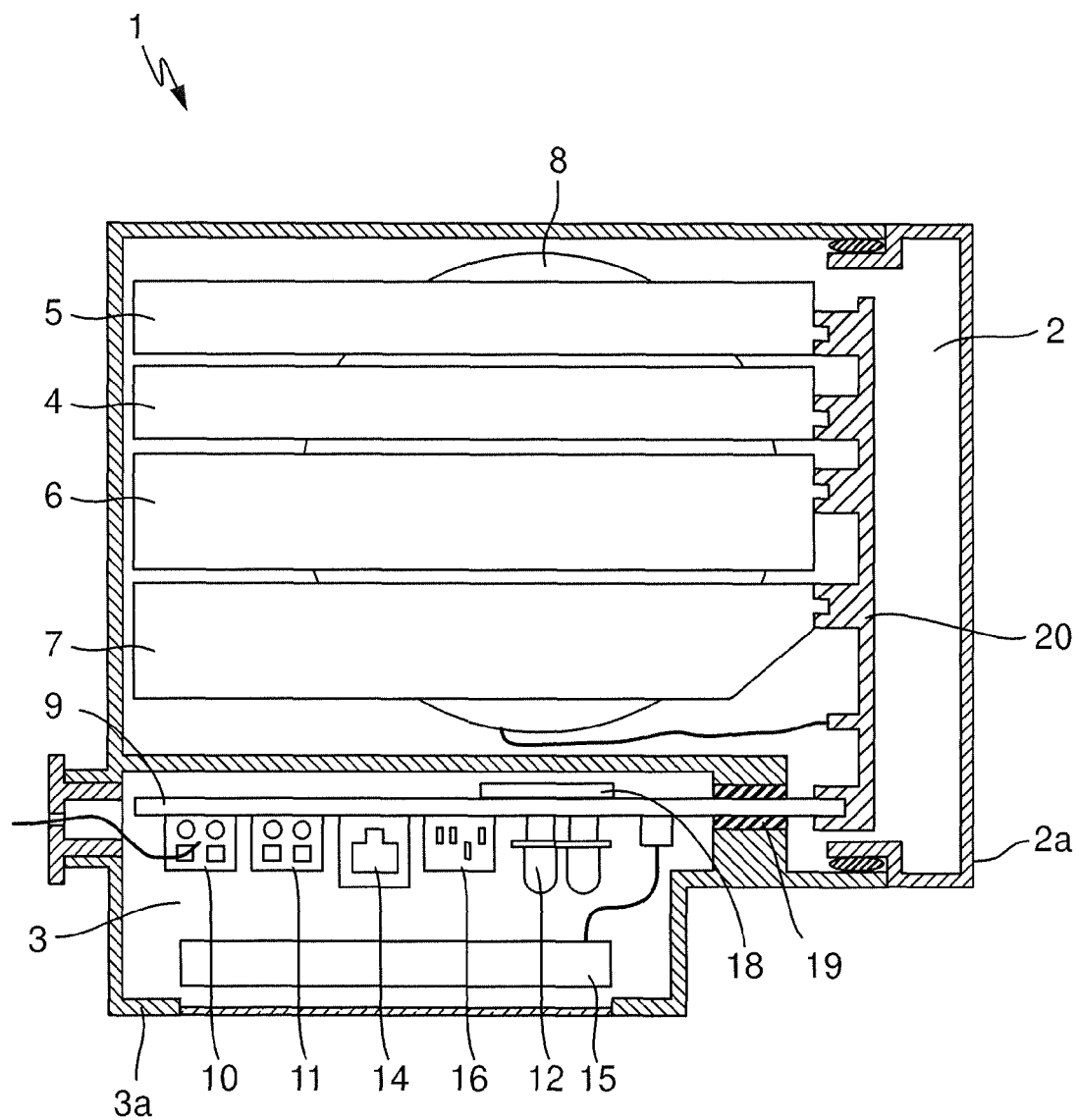

ELECTRONIC DEVICE HAVING A HOUSING FOR ACCOMMODATING ELECTRONIC COMPONENTS, PREFERABLY OF A PROCESS TRANSMITTER

TECHNICAL FIELD

The invention relates to an electronic device having a housing for accommodating electronic components, preferably electronic components forming a process transmitter, wherein the housing has two chambers, in which electronic components and user interfaces and/or connection elements for cable are arranged, and wherein the electronic components are arranged in a first chamber.

BACKGROUND DISCUSSION

Process transmitters, such as applied, for example, in process control technology, especially in the chemical industry, comprise various electronic components, such as, for example, a fieldbus, a measurement unit, or modules for in- and output of analog electrical signals, as well as a power supply. In order to be able to program or maintain these electronic components for the respective case of application, user interfaces are provided. The electronic components are connected with external devices via connection terminals. The housing of the process transmitter is embodied, in such case, as a one chamber housing, in which the electronic components are arranged together with user interfaces and connection elements. Known, however, are also two chamber housings, in the case of which the connection elements are positioned in a first chamber of the housing, while the electronic components and user interfaces are arranged in the second chamber.

This housing construction has the disadvantage that users must always open both housing chambers for programming or maintaining the process transmitter. This means that the electronic components are exposed to environmental influences upon the opening of the chambers. Furthermore, it is in the case of such a two chamber construction of the housing of the process transmitter necessary that users of the process transmitter must always be allowed access from both sides of the housing. This places increased requirements for the installed position of the housing at the location of use.

SUMMARY OF THE INVENTION

An object of the invention is thus to provide an electronic device having a housing for accommodating electronic components, in the case of which users have simple access to user interfaces, respectively connection elements, wherein the electronic components are reliably protected from environmental influences.

According to the invention, the object is achieved by features including that electronic components are arranged exclusively in the first chamber, while user interfaces of the electronic components and/or connection elements for cable are positioned exclusively in the second chamber. Due to the arrangement of user interfaces and the connection elements for cable in a shared chamber, users need be allowed access only to this one chamber, when the process transmitter should undergo maintenance or be adjusted for a certain measuring procedure. Moreover, there is the advantage that the installation of the housing at the location of use is simplified, since users require only access to one chamber and, thus, need access from only one side.

Advantageously, user interfaces and/or connection elements are arranged in the second chamber on a support element, which protrudes through a housing guide into the first chamber, where the support element is mechanically accepted in the first chamber by a plug system, which connects electrical lines of user interfaces and/or connection elements led on the support element electrically with respective electronic components. This support board reduces mechanical effort associated with the interface, since separate connecting of many cables between the first and the second chamber is then not necessary. This manner of electrically connecting the first chamber with the second chamber is especially suitable, when the first chamber must satisfy especially strict requirements as regards explosion protection, while lesser requirements regarding explosion protection apply to the second chamber. In configurations, in which the isolation of the chambers need not be fulfilled so strictly, the support element can also serve as a mechanical partition for the two chambers. The support element is then embodied in such a manner that the two chambers are isolated from one another. This includes protection as regards IP as well as insulation in the sense of electromagnetism. The plug system, which is connected with the support element, is, in such case, arranged in the explosion resistant, first chamber. This has the advantage that the lengths of the electrical lines within the plug system can be smaller. The plug system enables, thus, in the first chamber, besides the mechanical seating of the support element, simultaneously the electrical connecting of the user interfaces and/or connection elements arranged on the support element in the second chamber with the electrical components in the first chamber.

In an embodiment, the housing guide is sealed pressure-resistantly. In this way, it is prevented that an explosion possibly occurring in the first chamber, arising, for instance, from a spark discharge, can affect the second chamber.

In a further development, user interfaces lead to a switching logic arranged in the second chamber, preferably on the support element. The switching logic forwards the electrical signals of user interfaces by means of digital communication serially to the respective electronic components in the first chamber. This switching logic avoids that one or more electrical lines of each user interface must be led separately via the support element through the housing guide into the first chamber, a practice which would increase the number of interfaces. Since user interfaces are led to the switching logic and brought together by such, it is possible to keep the housing guide relatively small, in order to reduce the costs for the manufacture of the housing.

In a variant, the lines formed on the support element are separated for suppressing a mutual electromagnetic influencing of the transmitted, rapid, electrical signals. Since the number of lines behind the switching logic is significantly reduced, it is possible without problem to arrange these lines leaving the switching logic in a corresponding separation on the circuit board, the more so since the switching logic requires only little electrical current for its digital signals.

In an expanded variant the lines on the support element are shielded from one another, in order to suppress their mutual influencing of one another. This shielding can be embodied as an integral component of the support element.

In an additional form of embodiment, user interfaces are embodied as actuating elements, which, from the second chamber, operate the electronic components in the first chamber. Since the actuating elements control the electronic components remotely from a certain distance, all electronic components processing preferably a high power can be accommodated together in the first chamber. Thus, the first chamber can be kept small as regards space requirement.

Advantageously, the actuating elements are embodied as a switch, preferably a digital switch, whose signals are brought together via the switching logic and transmitted serially and especially terminate a fieldbus and/or select a relay functionality and/or select an analog input/output functionality. Since such digital switches require only little electrical current for their switching signals, an arrangement outside of an explosion resistant space is possible without problem. The switching signals of the digital switch are likewise brought together by the switching logic working with a small power and forwarded serially to the electronic components of the first chamber.

In an embodiment, user interfaces are embodied in LED, keyboard and/or display form. Due to this embodiment, all components, which have a higher electromagnetic compatibility, are shifted into the second chamber. This has, moreover, the advantage that users need only access one chamber for maintaining or adjusting the process transmitter.

In a further development, each chamber is provided with separate lid, wherein especially the lid of the first chamber is sealed. Since users need only open the lid of the second chamber for adjusting or maintaining the process transmitter, the first chamber is protected from environmental influences. Since the first chamber is sealed, it contains no actuating elements. The first chamber only needs to be opened when an electronic component located therein is defective.

In a variant, the first chamber is embodied explosion-resistantly, while the second chamber preferably includes a first region, in which user interfaces and/or connection elements are arranged in such a manner that the separation of the electrically conducting elements from one another assures that no short circuit is produced and, thus, no ignition can occur, and a second region, in which user interfaces and/or connection elements are arranged, which convert low power in such a manner that no sparks can be produced. This embodiment assures that the electronic components requiring a high energy for their functional ability, and, thus, also converting a high power, are all arranged in only one chamber, which is so embodied that, in the case of a possible malfunctioning of an electronic component leading to a spark that causes an explosion, damage to the first chamber remains limited. A reaching of the explosion to the second chamber is reliably prevented. The second chamber is divided according to the criteria of explosion protection into two regions. The first region separates the electrically conducting components in such a manner from one another that no short circuit can arise and is referred to as an EX-e region, which, besides, is provided with a lid. The second region, which is embodied as an Ex-i region, includes only components, which use low power. Thus, the second chamber of the housing can be spatially adapted corresponding to the respective requirements of the explosion protection.

BRIEF DESCRIPTION OF THE DRAWING

The invention permits numerous forms of embodiment. One thereof will now be explained in greater detail based on the drawing, the sole FIGURE of which shows a section through a process transmitter.

DETAILED DISCUSSION IN CONJUCTION WITH THE DRAWING

The FIGURE shows a section through a process transmitter 1 in a housing. The housing is divided into two chambers 2, 3. The first chamber 2 is referred to as the electronics compartment and the second chamber 3 as the connector space. Arranged in the first chamber 2 are only electronic components, such as input/output units 4, 5, a fieldbus 6, as well as a power supply 7. Arranged beneath these electronic components 4, 5, 6, 7 is a measurements unit 8.

Arranged in the second chamber 3 is a support element in the form of a circuit board 9, on which various connection elements 10, 11 for accommodating external cables are located, together with a service interface 14 in the form of an RJ45 interface, and a display and keyboard 15. A number of micro switches 16 and LEDs 12 are also present on the circuit board 9. Likewise located on the circuit board 9 is a switching logic 18 in the form of a microprocessor. Since the switching logic 18 forwards only digital signals, it requires only a small amount of electrical current.

Circuit board 9, which bears in the second chamber 3 the described connection elements 10, 11, the service interface 14, the display 15 as well as the micro switches 16, the LEDs and the switching logic 18, protrudes with a free end through a housing guide 19 into the first chamber 2. By being in the housing guide 19, the circuit board 9 is joined with the housing. The end of the circuit board 9 protruding into the first chamber 2 is electromechanically accommodated by a plug system 20, with which also the electronic components 4, 5, 6, 7, 8 are connected.

The electronic connection between the display 15 as well as the digital micro switches 16 and the LEDs 12 arranged in the second chamber 3 occurs via the switching logic 18. All the mentioned components lead with traces formed on the circuit board 9 to the switching logic 18. The switching logic 18 brings together the information to be transmitted and transmits such serially to the first chamber 2. The serial signals output by the switching logic 18 are forwarded via electrical lines on the plug system 20 to the individual electronic components, such as one of the in- and output units 4, 5, the fieldbus 6, respectively the power supply 7 and the measurements unit 8.

Micro switch 16 can, for example, functionally terminate the fieldbus, define the relay functions normally open or normally closed, switch the analog input/output functionalities between active and passive or select their function as electrical current, pulse or frequency output.

The mentioned connection elements 10, 11 can embodied as a plug-, clamp- and/or screwed connection, which can be used as a connection for the fieldbus 6 and/or input/output units in 4, 5. The display and keyboard 15 is positioned in the second chamber 3 for on-site servicing of the process transmitter 1. Moreover, it is also possible to provide memory modules (not shown) in the second chamber 3 on the circuit board 9. Stored in such memory modules is the complete parametering of the process transmitter 1. This parametering can, in such case, be a mirroring of the process parameters as provided in the electronic components 4, 5, 6, 7. It can, however, also reflect the current data of the process state of the process transmitter 1. The arrangement of these memory modules in the first chamber 3 enables an easy accessibility for users.

Different forms of explosion protection are implemented in the two chambers 2, 3. Thus, the first chamber 2, which includes the electronic components 4, 5, 6, 7, 8, is embodied for Ex-d explosion protection, while the second chamber 3, which has the connection-, respectively user interface, spaces, is embodied for explosion protection according to the standards Ex-e, Ex-m and/or Ex-i. An Ex-d protection means a pressure resistant encapsulation of the housing and, thus, an explosion resistant housing. In this way, an explosion triggered by an electronic component 4, 5, 6, 7, 8 as a result of sparking cannot reach areas outside of the first chamber 2. For this reason, the lid 2a of the first chamber is connected with the first chamber 2 via a flame safe screw thread. By providing an additional seal of lead metal or the like between the first chamber 2 and the lid 2a, it can be assured that the first chamber 2 has not been opened and the therein contained components tinkered with.

In order to be able to meet the most varied of requirements of explosion protection, the second chamber 3 is divided into different regions, wherein in a first region, which is embodied according to the standard, Ex-e, electrically conducting components are separated from one another in such a manner that no short circuit can occur. This region is closed off, while an adjoining, second region, which is embodied corresponding to the standard, Ex-i, is made accessible. In order to meet the standard of Ex-i explosion protection, the energy made available to the components in this region is limited in such a manner that it is not sufficient to produce sparks.

The introduction of external cables into the housing of the process transmitter 1 occurs in such a manner that the cables meet the connection elements 10, 11 directly after their introduction. This has the advantage that no additional space is required for accommodating the cables. Furthermore, the signals can be filtered directly and, thus, disturbances by electromagnetic fields minimized. Moreover, the direct accessibility permits grounding of the shielding of the cable directly after entry into the housing.

As already explained, lid 2a is connected with the first chamber 2 via a flame safe screw thread. By providing an additional seal of lead metal or the like between the first chamber 2 and the lid 2a, it can be assured that the first chamber 2 was not opened and the therein contained components have not been tinkered with. In contrast, another lid 3a of the second chamber 3 is so embodied that it can be opened without problem, in order to permit maintenance personnel access to the connection elements 10, 11, the service interface 14, the digital micro switches 16 and the LEDs 12. Since for maintenance, respectively adjusting, of the process transmitter 1 only the lid of second chamber 3 must be opened, a better accessibility to the housing of the process transmitter 1 is provided at the location of installation, since access from only one side of the housing 1 is necessary.

Decisive is that users can access all interfaces of the device 1 required for maintenance, respectively programming, in the second chamber 3 behind just lid 3a. Lid 2a of the first chamber 2 is opened only when electronic elements 4, 5, 6, 7, 8 need to be replaced or repaired.

The invention claimed is:

1. An electronic device comprising:
a housing for accommodating electronic components, said housing including two chambers, in which electronic components and user interfaces and/or connection elements for cable are arranged, wherein;
said electronic components are arranged exclusively in a first chamber of said two chambers; and
said user interfaces and/or connection elements for cable are positioned exclusively in a second chamber of said two chambers; and
said user interfaces and/or connection elements for cable are arranged on a support element, which protrudes through a guide of said housing into said first chamber and which is mechanically accepted in said first chamber by a plug system, said plug system connecting electrical lines of said user interfaces and/or connection elements led on said support element electrically with respective said electronic components.

2. The electronic device as claimed in claim 1, wherein:
each of said two chambers is provided with a separate lid; and
the lid of said first chamber is sealed.

3. The electronic device as claimed in claim 2, wherein:
said housing guide is sealed pressure-resistantly.

4. The electronic device as claimed in claim 2, wherein:
said user interfaces and/or connection elements lead to a switching logic arranged in said second chamber, preferably on said support element; and
said switching logic forwards electrical signals of said user interfaces by means of digital communication serially to respective electronic components in said first chamber.

5. The electronic device as claimed in claim 4, wherein:
lines formed on said support element are separated for suppressing mutual electromagnetic influencing of transmitted, rapid, electrical signals.

6. The electronic device as claimed in claim 4, wherein:
said user interfaces are embodied as actuating elements, which, from said second chamber, operate said electronic components in said first chamber.

7. The electronic device as claimed in claim 6, wherein:
said actuating elements are embodied as a switch, whose signals are brought together via said switching logic and transmitted serially and terminate in a fieldbus and/or select a relay functionality and/or select an analog input/output functionality.

8. The electronic device as claimed in claim 1, wherein:
said user interfaces are embodied in LED, service interface, and/or display and keyboard form.

9. The electronic device as claimed in claim 1, wherein:
said electronic components form a process transmitter.

10. An electronic device comprising:
a housing for accommodating electronic components, said housing includes two chambers, in which electronic components and user interfaces and/or connection elements for cable are arranged, said electronic components are arranged in a first chamber of said two chambers; wherein:
electronic components are arranged exclusively in said first chamber, while user interfaces of said electronic components and/or connection elements for cable are positioned exclusively in the second chamber of said two chambers;
each chamber is provided with a separate lid; and
the lid of said first chamber is sealed.

11. The electronic device as claimed in claim 10, wherein:
said electronic components form a process transmitter.

12. An electronic device comprising:
a housing for accommodating electronic components, said housing includes two chambers, in which electronic components and user interfaces and/or connection elements for cable are arranged, said electronic components are arranged in a first chamber of said two chambers; wherein:
electronic components are arranged exclusively in said first chamber, while user interfaces of said electronic components and/or connection elements for cable are positioned exclusively in the second chamber of said two chambers; and
the first chamber is embodied explosion-resistantly, while the second chamber preferably includes a first region, in which user interfaces and/or connection elements are arranged in such a manner that separation of electrically conducting components from one another assures that no short circuit is produced and, thus, no ignition can occur, and a second region, in which user interfaces and/or connection elements are arranged, which convert low power in such a manner that no sparks can be produced.

13. The electronic device as claimed in claim 12, wherein: said electronic components form a process transmitter.

\* \* \* \* \*